(12) United States Patent
Biberger et al.

(10) Patent No.: US 10,741,360 B2
(45) Date of Patent: Aug. 11, 2020

(54) METHOD FOR PRODUCING A TEM SAMPLE

(71) Applicant: Carl Zeiss Microscopy GmbH, Jena (DE)

(72) Inventors: Josef Biberger, Wildenberg (DE); Stefan Lengweiler, Oberkochen (DE)

(73) Assignee: Carl Zeiss Microscopy GmbH, Jena (DE)

(*) Notice: Subject to any disclaimer, the term of this patent is extended or adjusted under 35 U.S.C. 154(b) by 0 days.

(21) Appl. No.: 16/382,713

(22) Filed: Apr. 12, 2019

(65) Prior Publication Data

US 2019/0318908 A1    Oct. 17, 2019

(30) Foreign Application Priority Data

Apr. 16, 2018   (DE) .................. 10 2018 108 974

(51) Int. Cl.
*H01J 37/304*  (2006.01)
*H01J 37/20*   (2006.01)
*H01J 37/28*   (2006.01)
*H01J 37/305*  (2006.01)
*H01J 37/317*  (2006.01)

(52) U.S. Cl.
CPC .......... *H01J 37/3045* (2013.01); *H01J 37/20* (2013.01); *H01J 37/28* (2013.01); *H01J 37/3056* (2013.01); *H01J 37/317* (2013.01); *H01J 2237/20278* (2013.01); *H01J 2237/2802* (2013.01); *H01J 2237/31745* (2013.01)

(58) Field of Classification Search
CPC ........ H01J 37/20; H01J 37/28; H01J 37/3045; H01J 2237/2802; H01J 2237/31755

USPC ................... 250/306, 307, 311, 492.1, 492.3
See application file for complete search history.

(56) References Cited

U.S. PATENT DOCUMENTS

| 7,474,419 | B2 | 1/2009 | Tappel et al. | |
| 2008/0258056 | A1* | 10/2008 | Zaykova-Feldman | ............. G01N 23/04 250/307 |
| 2011/0226947 | A1* | 9/2011 | Takahashi | ............. H01J 37/20 250/307 |
| 2014/0190934 | A1 | 7/2014 | Schmidt et al. | |
| 2015/0001176 | A1 | 1/2015 | Young | |
| 2017/0256380 | A1 | 9/2017 | Brogden et al. | |

OTHER PUBLICATIONS

C. Li et al., "An improved FIB sample preparation technique for site-specific plan-view specimens: A new cutting geometry", Ultramicroscopy 184, 2018, pp. 310-317.
L.A. Giannuzzi et al., "A review of focused ion beam milling techniques for TEM specimen preparation", Micron 30, 1999, pp. 197-204.
German Office Action, with translation thereof, for corresponding DE application No. 10 2018 108 974.0 dated Dec. 17, 2018.

* cited by examiner

*Primary Examiner* — Jason L McCormack
(74) *Attorney, Agent, or Firm* — Fish & Richardson P.C.

(57) ABSTRACT

In a method for producing a TEM sample, an object is fastened to an element of an object holder such that a surface to be processed of the object is arranged substantially perpendicularly to an axis of rotation of the element. An ion beam is directed at the surface to be processed at grazing incidence, wherein the element adopts different rotational positions in relation to the axis of rotation, while the ion beam is directed at the surface to be processed.

20 Claims, 5 Drawing Sheets

METHOD FOR PRODUCING A TEM SAMPLE

CROSS-REFERENCE TO RELATED APPLICATION

This application claims benefit under 35 U.S.C. § 119 to German Application No. 10 2018 108 974.0, filed Apr. 16, 2018. The contents of this application is hereby incorporated by reference in its entirety.

FIELD

The present disclosure relates to a method for producing a TEM sample using a particle beam system.

BACKGROUND

Transmission electron microscopy (TEM) is a method for presenting and analysing miniaturized objects having a size of an order of magnitude of a few nanometres. TEM is used, for example, for analysing integrated switching elements. To this end, the object to be examined must be sufficiently thin to allow electrons of an electron beam to penetrate the object, i.e. to be transmitted by the object. In addition, the entry surface, at which the electron beam is incident on the object, and the exit surface, at which the electron beam exits the object again, should be as smooth as possible, i.e. have the lowest possible roughness. In some cases, the entry surface and the exit surface should be as parallel to one another as possible. However, there are applications in which the object to be examined and thus the entry and exit surfaces are to have a different form. An object that meets these requirements is suitable for analysis using TEM and will be referred to below as a TEM sample.

For producing TEM samples, particle beam systems having an ion beam column and an electron beam column are typically used. The ion beam column is used to process the object, while the electron beam column is used to produce images of the object and thus to monitor the object. For positioning and orienting the object in relation to the ion beam column and the electron beam column, a positioning apparatus is used. For example, the positioning apparatus includes a sample stage having three translational degrees of freedom and two rotational degrees of freedom for positioning and orientating the object relative to the ion beam column and the electron beam column. The positioning apparatus frequently includes further auxiliary constructions, which are arranged on the sample stage and provide further degrees of freedom for moving the object. These auxiliary constructions must be manufactured mechanically with great precision, imply further controlling outlay and further potential error sources in the positioning and orienting of the object.

It is therefore desirable to be able to produce TEM samples without the need to use such auxiliary constructions.

US 2014/0 190 934 A1 discloses a method and an apparatus for preparing samples for observation in a system with charged particle beams in a way that reduces or prevents artifacts. Material is deposited onto the sample using charged particle beam deposition just before or during the final milling, which results in an artifact-free surface. Embodiments are useful for preparing thin TEM samples.

US 2017/0 256 380 A1 discloses techniques that facilitate automated extraction of lamellae and attaching the lamellae to sample grids for viewing on transmission electron microscopes.

US 2015/0 001 176 A1 discloses a method and an apparatus for altering the orientation of a sample that is processed and analysed using a particle beam system.

C. Li et al., "An improved FIB sample preparation technique for site-specific plan-view specimens: A new cutting geometry", Ultramicroscopy 184 (2018), pages 310 to 317, discloses FIB Lift-Out sample preparation.

L. A. Giannuzzi et al., "A review of focused ion beam milling techniques for TEM specimen preparation", Micron 30 (1999), pages 197 to 204, discloses methods for producing transmission electron microscope samples using a focused ion beam.

SUMMARY

The present disclosure seek to provide a method for producing a TEM sample which utilizes only a constructively simple approach to perform the method.

The following text will offer initially an overview of a method for producing a TEM sample. Next, individual method steps will be described in detail. The starting position for the method according to the invention for providing a TEM sample is a body that includes a spatial region forming the TEM sample to be produced.

In a first step, a part of the body is separated at least in part from the body by directing an ion beam, which is generable by an ion beam column, at the body. This part of the body will be referred to below as the object. The object is physically still connected to the body at those locations at which the ion beam was not directed at the body.

In a second step, a manipulator is attached to the object. By way of example, a manipulator is guided to the surface of the object and, using the ion beam, the manipulator is connected to the object.

In a third step, the object is separated completely from the body, for example by removing the section connecting the object to the body using the ion beam. At this point in the method, the object is carried by the manipulator and is no longer physically connected to the body.

Alternatively to the method steps just described, the object can be detached from the body and connected to the manipulator in another way. For example, the manipulator may be attached to the surface of the body first, and then a part of the body that is physically connected to the manipulator is separated from the body using an ion beam.

In a fourth step, the object is transferred to an object holder for further processing. For example, the manipulator, to which the object is attached, is moved such that the object comes into contact with the object holder. Next, the object is fastened to the object holder using an ion beam. The object holder thus carries the object.

In a subsequent fifth step, the manipulator is detached from the object. For example, the manipulator is detached from the object using an ion beam. At this point in the method, the object is carried solely by the object holder. The object holder is, for example, a sample stage of a particle beam system or a TEM grid fastened to the sample stage.

In a sixth step, the object is thinned using an ion beam. By way of example, material is removed from the object using an ion beam to retain the desired shape of the object. By way of example, the object can be processed using the ion beam such that the object has two mutually substantially parallel surfaces and the distance between these surfaces is sufficiently small for a TEM analysis. For example, a distance between the mutually substantially parallel surfaces is at least 10 nm and at most 1000 nm. Alternatively, the object can be processed using the ion beam such that it has the shape of a wedge or the like. In the sixth step, the object is thinned such that the object has a thickness that is low enough for the object to be analysed by TEM.

After thinning the object, the surface of the object may have a roughness that is produced by the thinning using the ion beam. In order to further smooth the surface of the object, the surface of the object is polished using the ion beam in a seventh step, i.e. material is removed from the object. Alternatively, thinning and polishing of the object may be performed simultaneously, or be effected by the same method steps.

The method steps for polishing the object will be described in detail below.

Polishing the object is performed using a particle beam system that includes an ion beam column for producing an ion beam and an object holder for holding, positioning and orientating the object relative to the ion beam column. The object holder has a base element, a first element, a second element, a first actuator and a second actuator. The base element, the first element and the second element form a kinematic chain, which can be moved and/or orientated relative to one another by the actuators.

For example, the base element is arranged within a vacuum chamber of the particle beam system, wherein the base element itself can be positioned and orientated within the vacuum chamber by way of at least one further actuator. The first element can be rotated relative to the base element about a first axis of rotation by way of the first actuator. The second element can be rotated relative to the first element about a second axis of rotation by way of the second actuator. The object holder is configured such that the first axis of rotation and the second axis of rotation are orientated such that they are substantially perpendicular relative to one another.

When the first actuator rotates the first element about the first axis of rotation, the second element likewise rotates about the first axis of rotation in accordance with this configuration. However, the first element is not rotated about the second axis of rotation when the second actuator rotates the second element about the second axis of rotation.

For the purpose of thinning and/or polishing the object, the object is fastened to the second element of the object holder.

The object is fastened here to the second element such that a surface to be processed of the object is arranged substantially perpendicularly to the second axis of rotation. For example, the object is fastened to the second element of the object holder such that an angle between the surface to be processed of the object and the second axis of rotation is at least 80°, preferably at least 85°, with further preference at least 89°.

The first actuator is controlled such that a main axis of the ion beam column is orientated at grazing incidence to the surface to be processed, while the second actuator is controlled such that the second element has, with respect to the first element, a first rotational position about the second axis of rotation. "Grazing incidence" means, for example, that the main axis of the ion beam column encloses an angle of at most 10° with the surface to be processed.

During this configuration of the actuators, that is to say while the main axis of the ion beam column is orientated at grazing incidence to the surface to be processed and the second element has the first rotational position about the second axis of rotation in relation to the first element, an ion beam produced by the ion beam column is directed at the object to remove material from the object.

Subsequently, the first actuator is controlled such that the main axis of the ion beam column is (continues to be) orientated at grazing incidence to the surface to be processed, while the second actuator is controlled such that the second element has, with respect to the first element, a second rotational position about the second axis of rotation, with the second rotational position being different from the first rotational position. In the simplest case, the second actuator produces a rotation of the second element relative to the first element about the second axis of rotation, whereby the rotational position of the second element with respect to the first element is changed from the first rotational position to the second rotational position, while the actuation of the first actuator remains unchanged.

In this configuration of the actuators, that is to say while the main axis of the ion beam column is orientated at grazing incidence to the surface to be processed and the second element has the second rotational position about the second axis of rotation with respect to the first element, the ion beam produced by the ion beam column is directed at the object to remove (again) material from the object.

In this way, the ion beam is directed at the object from different directions, yet in each case at grazing incidence to the surface to be processed. Irregularities of the surface of the object, i.e. the roughness of the object that was produced by the preceding processing of the object, can be reduced in this way. Owing to the special arrangement of object (more specifically of the surface to be processed of the object) relative to the second element of the object holder, to the configuration of the object holder itself and to the orientation of the main axis of the ion beam column (more specifically of the ion beam) relative to the surface to be processed, the roughness of the surface to be processed can be reduced by merely rotating the second element about the second axis of rotation and the ion beam, with two different rotational positions of the second element with respect to the first element about the second axis of rotation, being directed onto the object. Owing to this special configuration, the roughness of the surface to be processed can be reduced without auxiliary apparatuses being necessary in addition to a sample stage. This simplifies the configuration the controlling outlay of the system used to perform the method.

According to an exemplary embodiment, the first rotational position differs from the second rotational position by at least 5°, preferably at least 10°. That is to say, when changing the second element of the object holder from the first rotational position to the second rotational position, the second element performs, with respect to the first element, a rotation about the second axis of rotation of at least 5°, preferably at least 10° and/or at most 45°, preferably at most 35°.

In accordance with an exemplary embodiment, the second element forms the last kinematic element with respect to the (rotational) degrees of freedom provided by the object holder. That is to say the object is fastened to that element of the object holder which has the most (rotational) degrees of freedom of movement in relation to the base element. In other words, the object is fastened to the object holder such and the object holder is embodied such that no controllable degree of freedom of movement between the object and the second element of the object holder exists.

The object holder can be configured such that the rotatability of the first element relative to the base element about the first axis of rotation is realized without degrees of freedom inbetween. That means that, except for the rotatability about the first axis of rotation, no other controllable degrees of freedom, especially no other rotational degrees of freedom, are realized in the kinematic chain between the base and the first element. For example, the base and the first element are in each case connected directly to a first bearing apparatus, which provides the degree of freedom of rotatability about the first axis of rotation, but no further (rotational) degrees of freedom beyond that.

The object holder can be configured such that the rotatability of the second element relative to the first element about the second axis of rotation is realized without degrees of freedom inbetween. That means that, except for the rotatability about the second axis of rotation, no other controllable degrees of freedom, especially no other rotational degrees of freedom, are realized in the kinematic chain between the first element and the second element. For example, the first element and the second element are in each case connected directly to a second bearing apparatus, which provides the degree of freedom of rotatability about the second axis of rotation, but no further (rotational) degrees of freedom beyond that. Owing to the configuration of the object holder, the fastening of the object to the second element is therefore rigid (at least in relation to rotations).

In accordance with an exemplary embodiment, the ion beam is directed at least temporarily at the object during the rotation of the second element from the first rotational position into the second rotational position. In particular, the ion beam is directed at the object for the duration of the rotation of the second element from the first rotational position into the second rotational position. As a result, the ion beam is directed at the object from a multiplicity of directions, but always at grazing incidence to the surface to be processed, thus better smoothing the surface of the object.

Alternatively, the ion beam may not be directed at the object during the rotation of the second element from the first rotational position into the second rotational position.

In accordance with a preferred embodiment, the object is arranged before the thinning/polishing such that the second axis of rotation passes through the surface to be processed. In this way, control of the actuators can be simplified because, during rotation of the second element about the second axis of rotation, the surface to be processed performs substantially only a rotation and not a translation relative to the first element.

For the ion beam to remain directed at the surface to be processed during the rotation of the second element about the second axis of rotation, no translation of the surface to be processed relative to the first element (and thus also relative to the ion beam column) needs to be compensated in this embodiment.

In accordance with an alternative embodiment, the object is arranged before the thinning/polishing such that the second axis of rotation does not pass through the surface to be processed of the object.

In accordance with an advantageous embodiment, the particle beam system for performing the method furthermore includes an electron beam column. The main axis of the electron beam column and the main axis of the ion beam column can pass through a common work region, in which the object can be arranged using the object holder. The main axis of the electron beam column and the main axis of the ion beam column can be located substantially in a common plane. In this embodiment, the base element of the object holder can be adjusted, for example by way of one or more actuators, such that the first axis of rotation is orientated substantially perpendicularly to the common axis. This makes it possible that the object to be processed can be directed onto the main axis of the electron beam column and/or onto the main axis of the ion beam column solely by the actuation of the first actuator, i.e. by rotating the first element of the object holder relative to the base element of the object holder. Furthermore, in this configuration in which the first axis of rotation is orientated perpendicularly to the main axis of the ion beam column, the angle between the surface to be processed of the object and the main axis of the ion beam column and thus the angle of incidence of the ion beam on the surface to be processed of the object can be simply set merely by actuating the first actuator. This configuration therefore has the synergetic effect that both the angle of incidence of the ion beam on the surface to be processed of the object and the adjustment of the object with respect to both the main axis of the electron beam column and the main axis of the ion beam column can be effected by actuating a single actuator, that is the first actuator.

To monitor the progress of the manufacturing method, that is to say to monitor the state of the object during the processing of the object using the ion beam, an electron beam produced by the electron beam column can be directed at the object and the electrons coming from the object can be detected. Images of the object can hereby be recorded using the electron beam during the processing of the object.

In accordance with a preferred embodiment, the object holder includes at least one further actuator which is configured to translate the second element in relation to the base element in at least two, preferably three different directions. The object can thus be arranged such that the main axis of the ion beam column and/or the main axis of the electron beam column pass through the object or that the object is arranged in the common work region of the ion beam column and the electron beam column.

BRIEF DESCRIPTION OF THE DRAWINGS

Embodiments of the present invention will be described in detail below with reference to the attached figures.

DETAILED DESCRIPTION OF EXEMPLARY EMBODIMENTS

Figure 1:
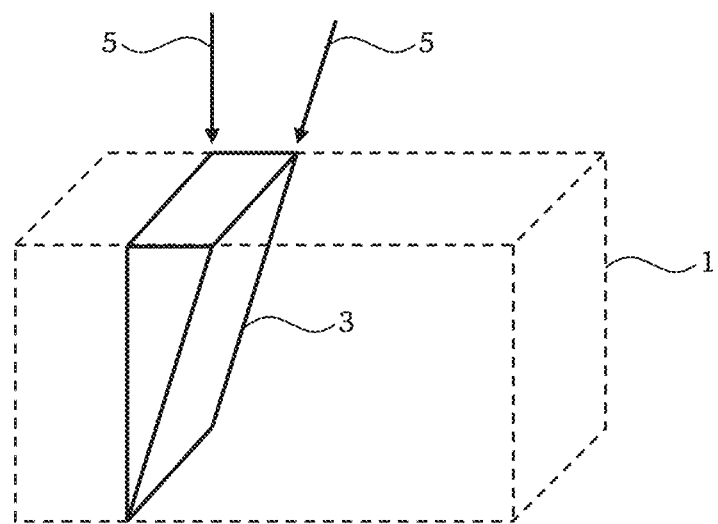
FIGS. 1 to 5 show different stages of an object during the production of a TEM sample.

FIGS. 1 to 5 show the basic steps during the production of a TEM sample. As shown in FIG. 1, a body 1, which is depicted in dashed lines, includes an object 3. The object 3 is a volume region of the body 1 and contains the volume region that forms the TEM sample.

For producing the TEM sample, the object 3 is separated in a first step at least partially from the body 1. To this end, an ion beam 5 is directed from multiple different directions at the body 1, as a result of which material is removed from the body 1. The object 3 is, however, not completely separated from the body 1, but remains physically connected to the body 1, which means that the body 1 carries the object 3.

Figure 2:
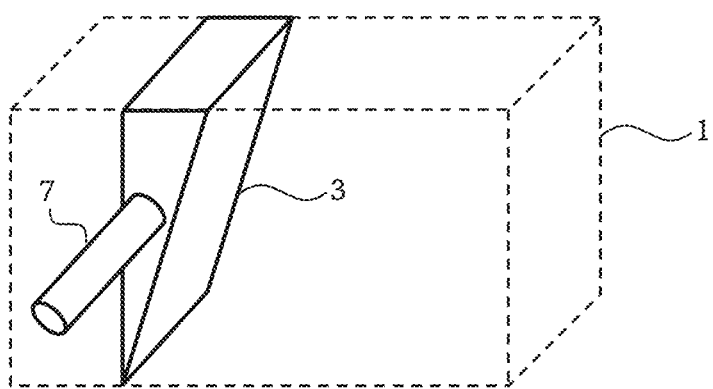

In a second step, a manipulator 7 is attached to the object 3 which has been partially separated from the body 1, as is illustrated in FIG. 2. For example, the manipulator 7 is brought into contact with the object 3 and the contact location is subsequently irradiated with the ion beam to connect the object 3 to the manipulator 7. At this stage of the method, the object 3 is carried both by the body 1 and by the manipulator 7.

In a third step, the object 3 is separated completely from the body 1. For example, the ion beam is to this end directed at those locations of the body 1 which still connect the object 3 to the body 1. As a consequence, the object 3 is separated completely from the body 1, and the object 3 is now carried only by the manipulator 7. The object 3 can now be removed from the body 1 using the manipulator 7.

Figure 3:
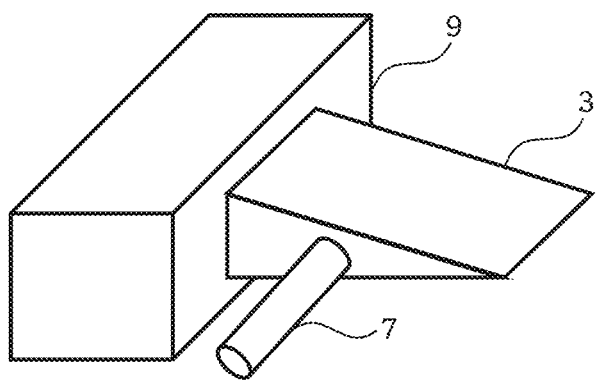

In a fourth step, the object 3 is transferred, using the manipulator 7, from the body 1 to an object holder. FIG. 3 illustrates a part of the object holder, which is usually referred to as "TEM grid". The TEM grid 9 is typically a body of macroscopic size, which can be transported, for example, using a pair of tweezers.

After the object 3 has been transported to the TEM grid 9 with the use of the manipulator 7, the object 3 is fastened, for example, using an ion beam, to the TEM grid 9, which concludes the transfer step.

Figure 4:
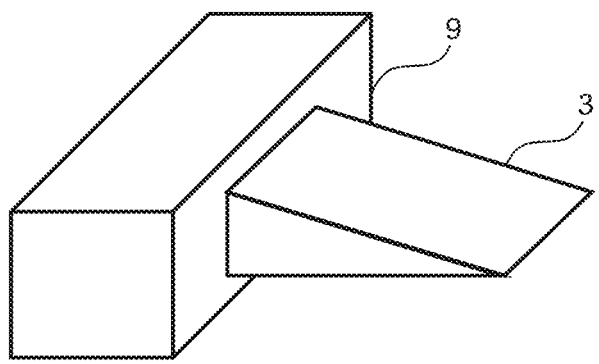

In a fifth step, the manipulator 7 is detached from the object 3 after the object 3 was transferred to the TEM grid 9. This situation is shown in FIG. 4.

The object 3 contains the volume region, which is to ultimately form the TEM sample. Since the object 3 at this stage of the production process is usually not yet sufficiently thin for analysis by way of TEM and an entry surface and an exit surface for an analysis by way of TEM is not yet sufficiently smooth, the object 3 is thinned using an ion beam in a sixth step. During the thinning of the object 3, material is removed from the object by way of the ion beam.

Figure 5:
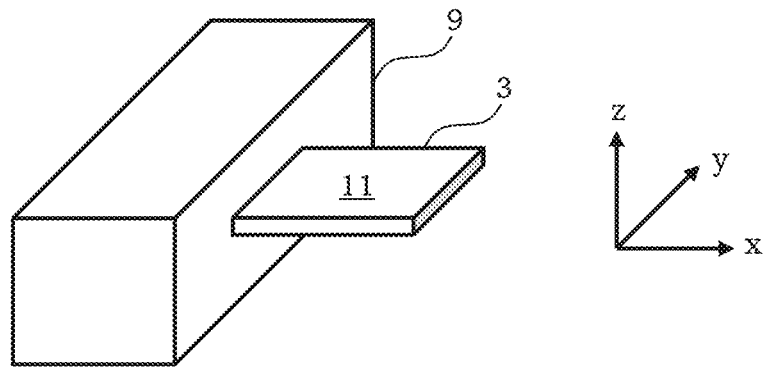

FIG. 5 shows the object 3 after thinning. The object 3 at this stage of the production process typically has a flat shape, that is to say the dimension of the object 3 in the z-direction is significantly smaller than the dimension of the object 3 in the x-direction and the y-direction. The thickness of the object 3, that is to say the dimension of the object 3 in the z-direction, is, for example, only 1000 nm or less, while the dimension of the object 3 in the x-direction and the y-direction is a few micrometres. The surface 11 serves in an analysis of the object 3 by way of TEM as the entry and/or exit surface for an electron beam. To this end, the surface 11 must be as smooth as possible. In order to smooth the surface 11, that is to say reduce the roughness of the surface 11, the surface 11 is polished by way of the method described below.

Alternatively, thinning and polishing can be carried out together in one common step.

The thinning/polishing of the object 3 is performed by using a particle beam system including an ion beam column and an object holder 13. The object holder 13 shown in FIG. 6 includes a base element 15, a first element 17 and a second element 19. The object holder 13 further includes a first actuator, which is configured to rotate the first element 17 with respect to the base element 15 about a first axis of rotation 21. The object holder 13 further includes a second actuator, which is configured to rotate the second element 19 with respect to the first element 17 about a second axis of rotation 23. The object holder 13 can include further actuators, which can position and orientate the base element 15. The first axis of rotation 21 is orientated substantially perpendicularly to the second axis of rotation 23. The object holder 13 is arranged, for example, in a vacuum chamber of the particle beam system.

The object 3 was fastened to the TEM grid 9 in a preceding step. The object 3 is fastened to the second element 19 of the object holder 13 via the TEM grid 9 such that the surface 11 that is to be subsequently processed is orientated substantially perpendicularly to the second axis of rotation 23. That is to say, when the second element 19 is rotated with respect to the first element 17 about the second axis of rotation 23, the surface 11 remains during the rotation within a plane that is perpendicular to the second axis of rotation 23 and parallel to the surface 11 of the object 3.

It should be stressed that the base element 15, the first element 17 and the second element 19 form a kinematic chain, wherein the second element is the last element of the kinematic chain with respect to the base element 15. That is to say, with reference to the base element 15, the second element 19 has the most (rotational) degrees of freedom of movement. The second element 19 in the example shown in FIG. 6 has two (rotational) degrees of freedom of movement in relation to the base element 15, specifically the degree of freedom of the rotation about the second axis of rotation 23 and the degree of freedom of the rotation about the first axis of rotation 21 (via the first element 17). The first element 17 has a (rotational) degree of freedom of movement in relation to the base element 15, specifically the degree of freedom of the rotation about the first axis of rotation 21.

The object 3 is fastened rigidly to the second element 19, that is to say no controllable degree of freedom of movement exists between the object 3 and the second element 19. Accordingly, the object 3 performs the same movements as the second element 19.

Consequently, the object holder 13 is embodied such that the second element 19 is rotated about the first axis of rotation 21 when the first element 17 is rotated about the first axis of rotation 21 by way of the first actuator. However, the first element 17 is not rotated about the second axis of rotation 23 when the second element 19 is rotated relative to the first element 17 about the second axis of rotation 23 by way of the second actuator.

Figure 7:
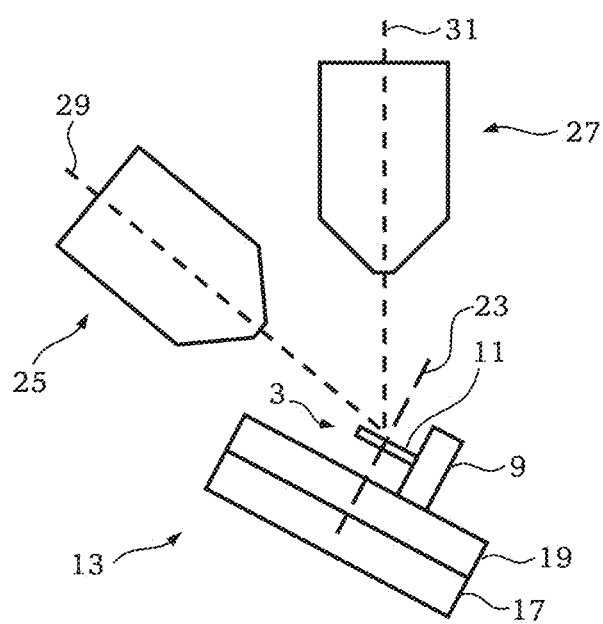
FIG. 7 shows a spatial arrangement of the object shown in FIG. 6 in relation to an ion beam column and an electron beam column.

FIG. 7 shows the arrangement of the object 3 with respect to an ion beam column 25 and an electron beam column 27 of the particle beam system. The dashed line 29 represents a main axis of the ion beam column 25. A dashed line 31 represents a main axis of the electron beam column 27. For reasons of simplification, FIG. 7 merely illustrates the first element 17 and the second element 19 of the object holder 13. Furthermore illustrated is the second axis of rotation 23. The first axis of rotation 21 is perpendicular to the drawing plane of FIG. 7.

Figure 8:
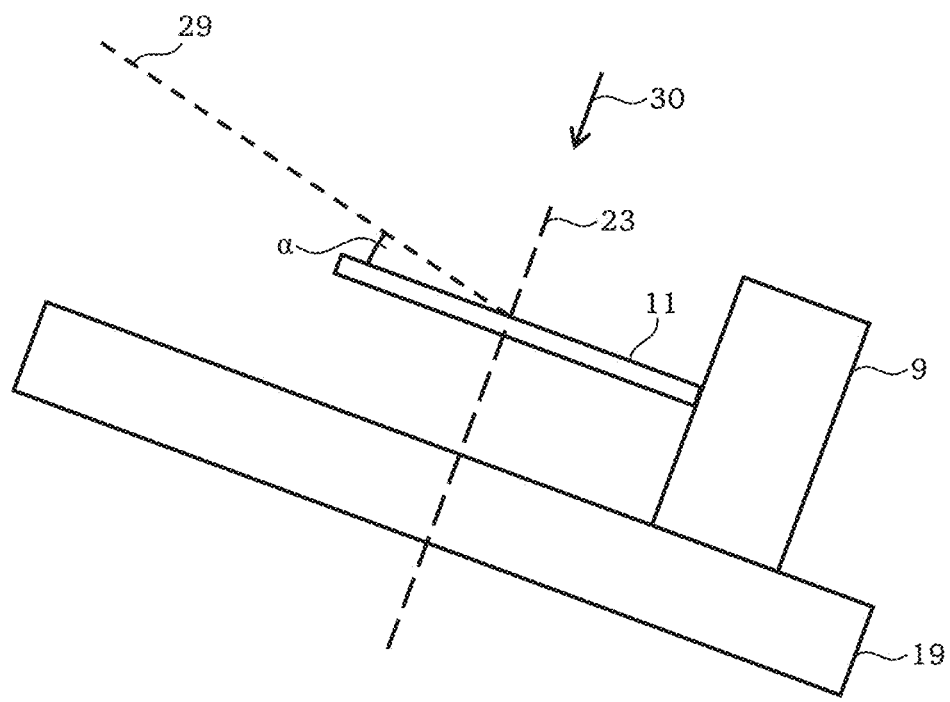
FIG. 8 shows an enlarged representation of the arrangement shown in FIG. 7.

FIG. 8 is an enlarged illustration of the arrangement shown in FIG. 7 for explaining the spatial relationships between the object 3, the second axis of rotation 23 and the main axis 29 of the ion beam column 25.

The first actuator is controlled such that the main axis 29 of the ion beam column 25 is orientated at grazing incidence to the surface 11 to be processed, while the second actuator is controlled such that the second element 19 has, in relation to the first element 17, a first rotational position about the second axis of rotation 23. The main axis 29 of the ion beam column 25 encloses an angle $\alpha$ of, for example, at most 10° with the surface 11 to be processed. Under this condition, the ion beam produced by the ion beam column 25 is incident on the surface 11 to be processed at grazing incidence.

Figure 9:
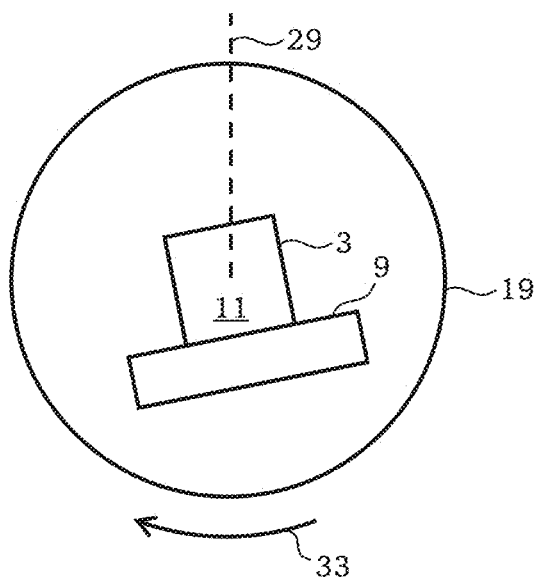
FIGS. 9 and 10 show a spatial arrangement of the situation shown in FIGS. 7 and 8 from the perspective of the second axis of rotation.

FIG. 9 shows the spatial arrangement, in which the second element 19 has, in relation to the first element 17, the first rotational position about the second axis of rotation 23, from the perspective along the second axis of rotation 23. The perspective is indicated in FIG. 8 by an arrow 30.

While the main axis 29 of the ion beam column 25 is orientated at grazing incidence to the surface 11 to be processed and the second element 19 has the first rotational position about the second axis of rotation 23 in relation to the first element 17, an ion beam produced by the ion beam column 25 is directed at the object 3 (more specifically at the surface 11 to be processed). The material is hereby removed from the surface 11 to be processed, which reduces the roughness of the surface 11.

Subsequently, the first actuator is (continues to be) controlled such that the main axis 29 of the ion beam column 25 is orientated at grazing incidence to the surface 11 to be processed, while the second actuator is controlled such that the second element 19 has, in relation to the first element 17, a second rotational position about the second axis of rotation 23. The second rotational position differs from the first rotational position.

Changing from the first rotational position to the second rotational position is accomplished for example by the second element 19 being rotated relative to the first element 17 about the second axis of rotation 23.

Figure 10:
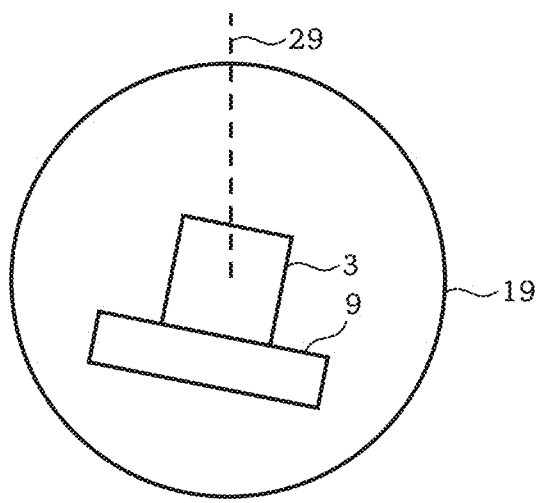

FIG. 10 shows the spatial arrangement, in which the second element 19 has, in relation to the first element 17, the second rotational position about the second axis of rotation 23, from the perspective along the second axis of rotation 23. The perspective is indicated in FIG. 8 by an arrow 30. In order to change the second element 19 from the first rotational position in relation to the second axis of rotation 23 shown in FIG. 9 to the second rotational position shown in FIG. 10, the second actuator was actuated such that the second element 19 performs, in relation to the first element 17, a rotation about the second axis of rotation 23. In the illustration shown in FIGS. 9 and 10, the second element 19 was accordingly rotated clockwise, indicated by the arrow 33.

Since the surface 11 to be processed is orientated substantially perpendicularly to the second axis of rotation 23 (cf. FIG. 8), the main axis 29 of the ion beam column 25 during the rotation of the second element remains orientated about the second axis of rotation at grazing incidence with respect to the surface 11 to be processed. In order to change the second element 19 from the first rotational position into the second rotational position, the second element 19 is rotated in relation to the first element 17 for example by at least 5°, preferably at least 10°.

While the main axis 29 of the ion beam column 25 is orientated at grazing incidence to the surface 11 to be processed and the second element 19 has the second rotational position in relation to the first element 17, the ion beam produced by the ion beam column 25 is directed at the object 3 (more specifically at the surface 11 to be processed), whereby material is removed from the object 3.

Owing to the method described above, an ion beam is directed at grazing incidence from different directions at a surface to be processed, whereby the roughness of the surface is reduced. As a result, the thinning/polishing is concluded and the production of the TEM sample is terminated.

During the changing of the second element 19 from the first rotational position into the second rotational position, the ion beam produced by the ion beam column 25 can be directed entirely, temporarily or not at all at the object.

Figure 6:
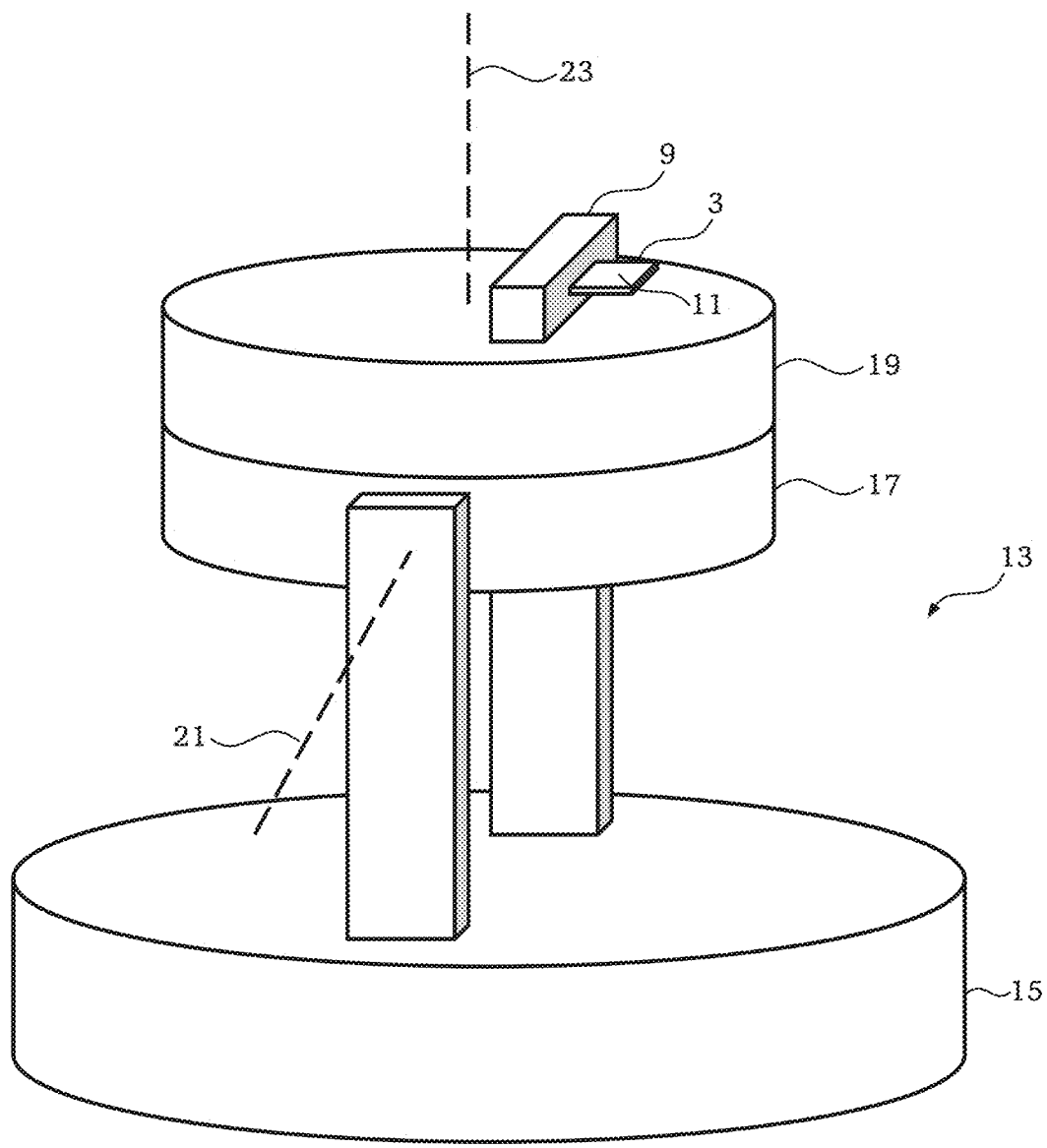
FIG. 6 shows an object holder having an object that is fastened thereto.

As is shown in FIGS. 7 and 8, the object 3, or the surface 11 to be processed of the object 3, can be fastened to the second element 19 of the object holder 13 such that the second axis of rotation 23 passes through the object 3, or the surface 11 to be processed of the object 3. Alternatively, as is shown in FIG. 6, the object 3, or the surface 11 to be processed of the object 3, can be fastened to the second element 19 of the object holder 13 such that the second axis of rotation 23 does not pass through the object 3, or the surface 11 to be processed of the object 3.

In conjunction with the embodiments described above, an object holder 13 was described which provides merely two degrees of freedom of movement, specifically the degree of freedom of the rotation about the first axis of rotation 21 and the degree of freedom of the rotation about the second axis of rotation 23. However, the object holder can provide further degrees of freedom of movement, for example translational degrees of freedom of movement.

What is claimed is:

1. A method for producing a TEM sample using a particle beam system, comprising an ion beam column and an object holder, wherein the object holder includes a base element, a first element, a second element, a first actuator and a second actuator, wherein the first actuator is configured to rotate the first element with respect to the base element about a first axis of rotation, wherein the second actuator is configured to rotate the second element with respect to the first element about a second axis of rotation, and wherein the first axis of rotation is orientated substantially perpendicularly to the second axis of rotation, wherein the method comprises: fastening an object to the second element of the object holder such that a surface to be processed of the object is arranged substantially perpendicularly to the second axis of rotation; and after fastening the object to the second element of the object holder, producing the TEM sample by polishing the object, wherein polishing comprises:
   controlling the first actuator such that a main axis of the ion beam column is orientated at a first grazing incidence to the surface to be processed, and controlling the second actuator such that the second element has, in relation to the first element, a first rotational position about the second axis of rotation; directing an ion beam produced by the ion beam column at the surface to be processed, while the main axis of the ion beam column is orientated at the first grazing incidence to the surface to be processed, and the second element has, in relation to the first element, the first rotational position about the second axis of rotation; controlling the first actuator such that the main axis of the ion beam column is orientated at a second grazing incidence to the surface to be processed, and controlling the second actuator such that the second element has, in relation to the first element, a second rotational position about the second axis of rotation, wherein the second rotational position differs from the first rotational position;
   and directing the ion beam produced by the ion beam column at the surface to be processed, while the main axis of the ion beam column is orientated at the second grazing incidence to the surface to be processed, and the second element has, in relation to the first element, the second rotational position about the second axis of rotation.

2. The method according to claim 1, wherein the object is fastened to the second element such and the object holder is embodied such that no controllable degree of freedom of movement between the object and the second element exists.

3. The method according to claim 1, wherein the object holder is embodied such that no further controllable rotational degree of freedom of movement between the second element and the first element exists.

4. The method according to claim 1,
wherein the object holder is embodied such that the second element is rotated about the first axis of rotation when the first element is rotated about the first axis of rotation, and/or
wherein the object holder is embodied such that the first element is not rotated about the second axis of rotation when the second element is rotated about the second axis of rotation.

5. The method according to claim 1, wherein the first rotational position differs from the second rotational position by at least 5°.

6. The method according to claim 1, wherein the ion beam is directed at least temporarily at the object while the second element is rotated from the first rotational position into the second rotational position about the second axis of rotation.

7. The method according to claim 1, wherein the ion beam is not directed at the object while the second element is rotated from the first rotational position into the second rotational position about the second axis of rotation.

8. The method according to claim 1, further comprising:
at least partially separating the object from a body using an ion beam produced by the ion beam column;
attaching a manipulator to the partially separated object;
completely separating the object to which the manipulator is fastened from the body;
transferring the object from the body to the object holder using the manipulator;
detaching the manipulator from the object after fastening the object to the second element of the object holder;
thinning and/or performing the polishing of the object, which is fastened to the second element, using an ion beam produced by the ion beam column.

9. The method according to claim 1, wherein the object is fastened to the second element such that an acute angle between the surface to be processed of the object and the second axis of rotation is at least 80°.

10. The method according to claim 1, wherein the method further comprises, before polishing the object:
adjusting the base element such that the first axis of rotation is orientated substantially perpendicularly to the main axis of the ion beam column.

11. The method according to claim 1, wherein the particle beam system furthermore comprises an electron beam column, wherein a main axis of the electron beam column and the main axis of the ion beam column substantially lie in a common plane and pass through a common work region;
wherein the method furthermore comprises, before polishing the object:
adjusting the base element such that the first axis of rotation is orientated substantially perpendicularly to the common plane.

12. The method according to claim 11, further comprising:
directing an electron beam produced by the electron beam column at the object and detecting electrons coming from the object.

13. The method according to claim 1, wherein the object holder comprises at least one further actuator which is configured to translate the second element in relation to the base element in at least two different directions; and
wherein the method furthermore comprises:
controlling the at least one further actuator of the object holder such that the main axis of the ion beam column passes through the object.

14. The method according to claim 2, wherein the object holder is embodied such that no further controllable rotational degree of freedom of movement between the second element and the first element exists.

15. The method according to claim 2,
wherein the object holder is embodied such that the second element is rotated about the first axis of rotation when the first element is rotated about the first axis of rotation, and/or
wherein the object holder is embodied such that the first element is not rotated about the second axis of rotation when the second element is rotated about the second axis of rotation.

16. The method according to claim 2, wherein the first rotational position differs from the second rotational position by at least 5°.

17. The method according to claim 3, wherein the first rotational position differs from the second rotational position by at least 5°.

18. The method according to claim 4, wherein the first rotational position differs from the second rotational position by at least 5°.

19. The method of claim 1, wherein:
the first grazing incidence means that the main axis of the ion beam column and the surface to be processed enclose an angle of at most 10°; and
the second grazing incidence means that the main axis of the ion beam column and the surface to be processed enclose an angle of at most 10°.

20. A method for producing a TEM sample using a particle beam system, comprising an ion beam column and an object holder, wherein the object holder includes a base element, a first element, a second element, a first actuator and a second actuator, wherein the first actuator is configured to rotate the first element with respect to the base element about a first axis of rotation, wherein the second actuator is configured to rotate the second element with respect to the first element about a second axis of rotation, and wherein the first axis of rotation is orientated substantially perpendicularly to the second axis of rotation, wherein the method comprises: fastening an object to the second element of the object holder such that an acute angle between a surface to be processed of the object and the second axis of rotation is at least 80°, wherein the object is fastened to the second element such and the object holder is embodied such that no controllable degree of freedom of movement between the object and the second element exists; and after fastening the object to the second element of the object holder, producing the TEM sample by polishing the object, wherein polishing comprises: controlling the first actuator such that a main axis of the ion beam column is orientated at a first grazing incidence to the surface to be processed, and controlling the second actuator such that the second element has, in relation to the first element, a first rotational position about the second axis of rotation; directing an ion beam produced by the ion beam column at the surface to be processed, while the main axis of the ion beam column is orientated at the first grazing incidence to the surface to be processed, and the second element has, in relation to the first element, the first rotational position about the second axis of rotation, wherein the first gracing incidence means that the main axis of the ion beam column and the surface to be processed enclose an angle of at most 10°; controlling the first actuator such that the main axis of the ion beam column is orientated at a second grazing incidence to the surface to be processed, and controlling the second actuator such that the second element has, in relation to the first element, a second rotational position about the second axis of rotation, wherein the second rotational position differs from the first rotational position, wherein the second gracing incidence means that the main axis of the ion beam column and the surface to be processed enclose an angle of at most 10°; and directing the ion beam produced by the ion beam column at the surface to be processed, while the main axis of the ion beam column is orientated at the second grazing incidence to the surface to be processed, and the second element has, in relation to the first element, the second rotational position about the second axis of rotation.

* * * * *